United States Patent
Cheng et al.

(10) Patent No.: US 7,615,443 B2
(45) Date of Patent: Nov. 10, 2009

(54) METHOD OF FORMING FINFET DEVICE

(75) Inventors: Chih-Hao Cheng, Taipei County (TW); Tzung-Han Lee, Taipei (TW)

(73) Assignee: Nanya Technology Corp., Kueishan, Tao-Yuan Hsien (TW)

(*) Notice: Subject to any disclaimer, the term of this patent is extended or adjusted under 35 U.S.C. 154(b) by 87 days.

(21) Appl. No.: 12/030,210

(22) Filed: Feb. 13, 2008

(65) Prior Publication Data
US 2009/0061580 A1    Mar. 5, 2009

(30) Foreign Application Priority Data
Aug. 29, 2007    (TW) .............................. 96132040 A (51) Int. Cl.
*H01L 21/8242* (2006.01)
(52) U.S. Cl. ....................... 438/243; 438/386; 438/733; 257/E21.17; 257/E21.229; 257/E21.248; 257/E21.231; 257/E21.304; 257/E21.396
(58) Field of Classification Search ................. 438/197, 438/238, 243, 386, 381, 506, 510, 680, 692, 438/700, 733, 745
See application file for complete search history.

(56) References Cited

U.S. PATENT DOCUMENTS

| 7,368,752 | B2* | 5/2008 | Luyken et al. ................. 257/71 |
| 7,371,657 | B2* | 5/2008 | Wellhausen et al. .......... 438/430 |
| 7,442,609 | B2* | 10/2008 | Wang et al. .................. 438/272 |
| 2006/0057814 | A1* | 3/2006 | Weis .......................... 438/386 |
| 2007/0057301 | A1* | 3/2007 | Wang et al. .................. 257/296 |

* cited by examiner

*Primary Examiner*—David Nhu
(74) *Attorney, Agent, or Firm*—Winston Hsu (57) ABSTRACT

The invention discloses a method of forming a finFET device. A hard mask layer is formed on an active area of a semiconductor substrate. A portion of the hard mask layer is etched to form a recess. A conformal gate defining layer is deposited on the recess and a tilt angle ion implantation process is performed. A part of the gate defining layer is removed to define a fin pattern. The fin pattern is subsequently transferred to the hard mask layer. The patterned hard mask layer having the fin pattern is utilized as an etching mask, and the semiconductor substrate is etched to form a fin structure.

6 Claims, 8 Drawing Sheets

METHOD OF FORMING FINFET DEVICE

CROSS-REFERENCE TO RELATED APPLICATIONS

This application is based upon and claims the benefit of priority from Taiwan application number 096132040 filed Aug. 29, 2007, the entire contents of which are incorporated herein by reference.

BACKGROUND OF THE INVENTION

1. Field of the Invention

The present invention is related to a method of forming a finFET device, and particularly, to a method of forming a self-aligned finFET device.

2. Description of the Prior Art

Dynamic random access semiconductor memory (DRAM) is comprised of memory cells, and the memory cells are electrically connected by word lines in the horizontal direction and are electrically connected by bit lines in the horizontal direction. By means of activating specific word lines or bit lines, data are read from or stored into the memory cells. Commonly speaking, each memory cells include a selection transistor and a storage capacitor. The selection transistor is a field-effect transistor (FET) of a lateral structure having two diffusion areas that are separated by a channel. In addition, a gate is formed on the channel. The word line connects the gate and one of the diffusion areas. The other diffusion area is connected to the storage capacitor. When a bias is applied to the gate through the word line, the selective transistor is activated and introduces a current into the diffusion areas. The storage capacitor is also charged by the bit line.

A finFET device of higher integrity and higher performance is disclosed to lend itself to become better suited for use in the current electronic product trend of miniaturization. The existing finFET device is an advanced device which is originated from the conventional standard-typed FET. The gate of the conventional FET switches the circuit on and off at only one side to allow the conduction of current. On the other hand, the gate of the finFET device is formed as a fin to switch the circuit at both sides of the gate. The finFET device operates the circuit more easily and has advantages such as shorter leakage path in the substrate, higher driving current, and lower short channel effect. In addition, the development of the finFET device is able to reduce the volume of the FET, increase the density of the finFET device on the wafer, improve the yield of the chips fabricated from each wafer, and effectively reduce production costs.

Conventional method for forming finFET devices is performed on a semiconductor substrate. Several processes are preformed for forming the finFET devices, which includes a etch process, a deposition process, a CMP process, and an ion implantation process to define an active area, a plurality of trench capacitors, a gate area, a drain area, and a source area disposed between the trench capacitors. A top trench oxide layer covers each of the trench capacitor. In order to form a narrow fin structure, a hard mask or a photoresist layer is formed on the surface of the semiconductor layer. Then, a lithography and etch process is performed to define an opening on the hard mask or the photoresist layer for exposing a part of the gate area and defining the position and the width of the fin structure. Followed by subsequent etch processes, a narrow fin structure is formed in the gate area.

However, the above-mentioned method for forming finFET devices has many defects that are needed to be improved and to be overcome. For example, the existing method for forming a fin structure of a finFET device is performed by means of performing several lithography and etch processes to define the gate structure. It is difficult to precisely sculpt the outline of the fin structure of the finFET device. In addition, CD variation of the fin structure of the finFET device is difficult to be controlled within the tolerance range when the fin structure of the finFET device is formed under a 70-nanometer process. As a result, a short circuit may occur between the finFET devices.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to the more detailed description that is presented later.

It is therefore an objective of the present invention to provide a method of forming a self-aligned fin structure that overcomes those problems in the prior art.

Accordingly, a method of forming a fin structure in a substrate is provided. First, a plurality of trench capacitors is formed in the substrate. Each trench capacitor has a top trench oxide layer disposed thereon, and a substrate top surface is exposed between two neighboring trench capacitors. A mask layer is formed on the substrate top surface, wherein a surface of the mask layer is lower than a surface of the dielectric layer formed on top of each of the trench capacitors. A gate defining layer is conformally formed on the surfaces of the mask layer and the dielectric layer. The gate defining layer is partially removed to partially expose the mask layer. The exposed mask layer is removed to partially expose the substrate. The exposed substrate is partially removed, and so that the fin structure in the substrate is formed.

Forming a finFET device using the method of the present invention may reduce the use of masks, photoresists, or hard masks for defining the fin structure during the lithography and etch process. The contour outline and the CD variation of the fin structure may also be under effective control.

These and other objectives of the present invention will no doubt become obvious to those of ordinary skill in the art after reading the following detailed description of the preferred embodiment that is illustrated in the various figures and drawings.

DETAILED DESCRIPTION

Hereinafter, preferred embodiments of the present invention will be described with reference to the accompanying drawings, in which components with substantially the same functions are identified by the same reference numeral for the sake of simplicity. It should be noted, however, that the present invention is in no way limited to the following illustrative embodiments.

Please refer to FIG. 1 through FIG. 8, which are schematic diagrams illustrating a method of forming a finFET device according to a preferred embodiment of the present invention. There is an objective of the present invention to form a 3D fin structure. For easier understanding, the following diagrams are shown as viewed from three different directions. Figure (a) is a top view, Figure (b) is a front view of Figure (a) taken along line B-B', and Figure (c) is a side view from the right side of Figure (a) taken along line C-C'.

Figure 1:
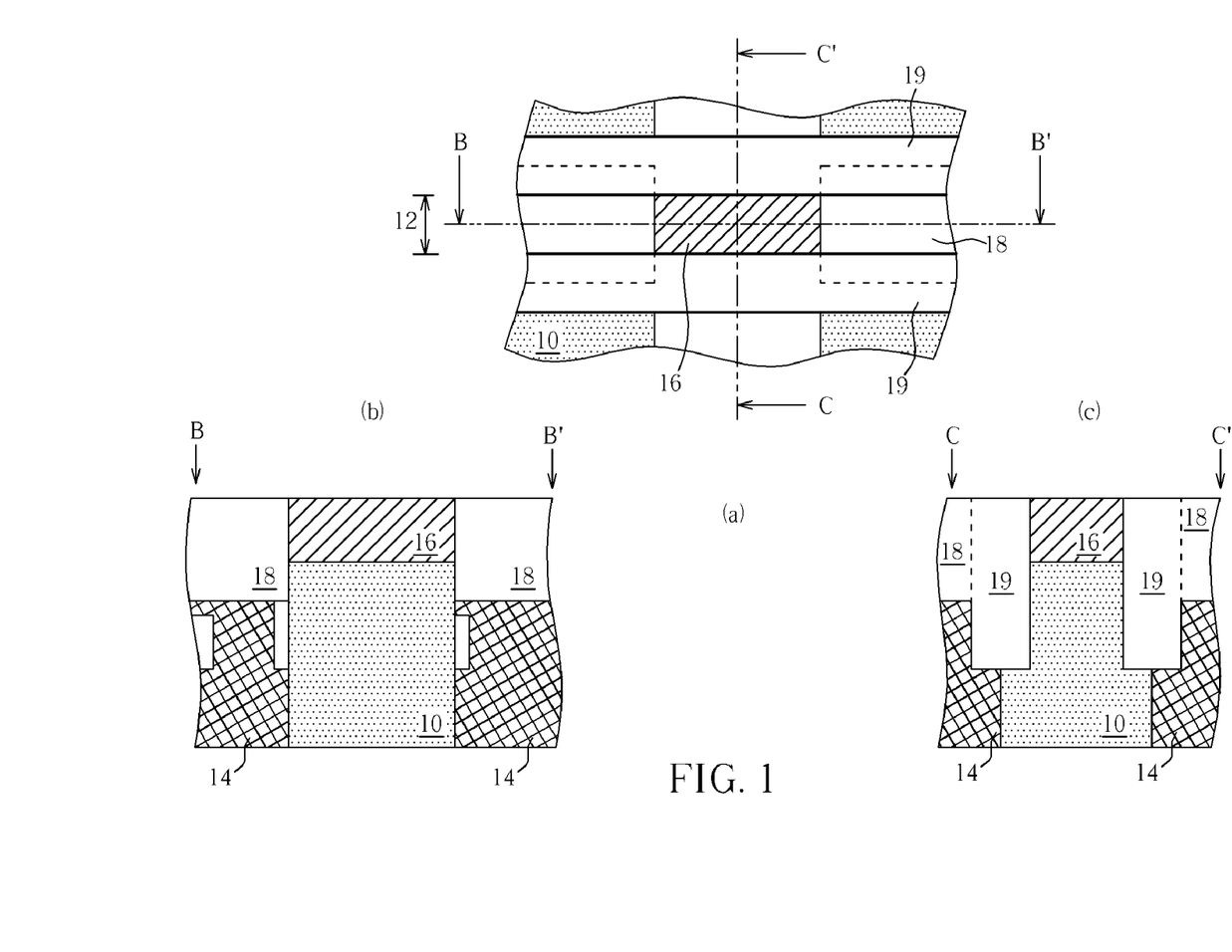
FIGS. 1-8 are schematic diagrams illustrating a method of forming a finFET device according to a preferred embodiment of the present invention.

As shown in FIG. 1, a semiconductor substrate 10, such as a silicon substrate, is provided. A plurality of active areas is defined in the semiconductor substrate 10, and a plurality of trench capacitors is embedded in the semiconductor substrate 10. Each active area is positioned between any two of the trench capacitors. For the sake of simplicity, the following preferred embodiment adopts two trench capacitors 14 and an active area 12 positioned between the trench capacitors 14 as an example. For each trench capacitor, a top trench oxide layer 18 is formed on each of the trench capacitors 14. The structure of the trench capacitors 14 is shown in a simplified form, and the components of the trench capacitors 14 are not shown in detail. The components of the trench capacitors 14 are not limited to the features shown in the diagrams.

As shown in FIG. 1, a hard mask layer 16 is formed on a surface of the active area 12 positioned between the trench capacitors 14. A plurality of isolation structures 19 is formed to cover an area of the semiconductor substrate 10 excluding from the active area 12 and a portion of the trench top layer 18. The area covered by the hard mask layer 16 may include a predetermined region for the gate (not shown) and a plurality of predetermined regions for the source/drain disposed aside the predetermined region for the gate. The isolation structure 19 formed in the semiconductor substrate 10 may be a shallow trench isolation for isolating the neighboring trench capacitors 14, and so as to minimize the size of the memory cells and to use the available spaces of the semiconductor substrate 10 as much as possible.

Figure 2:
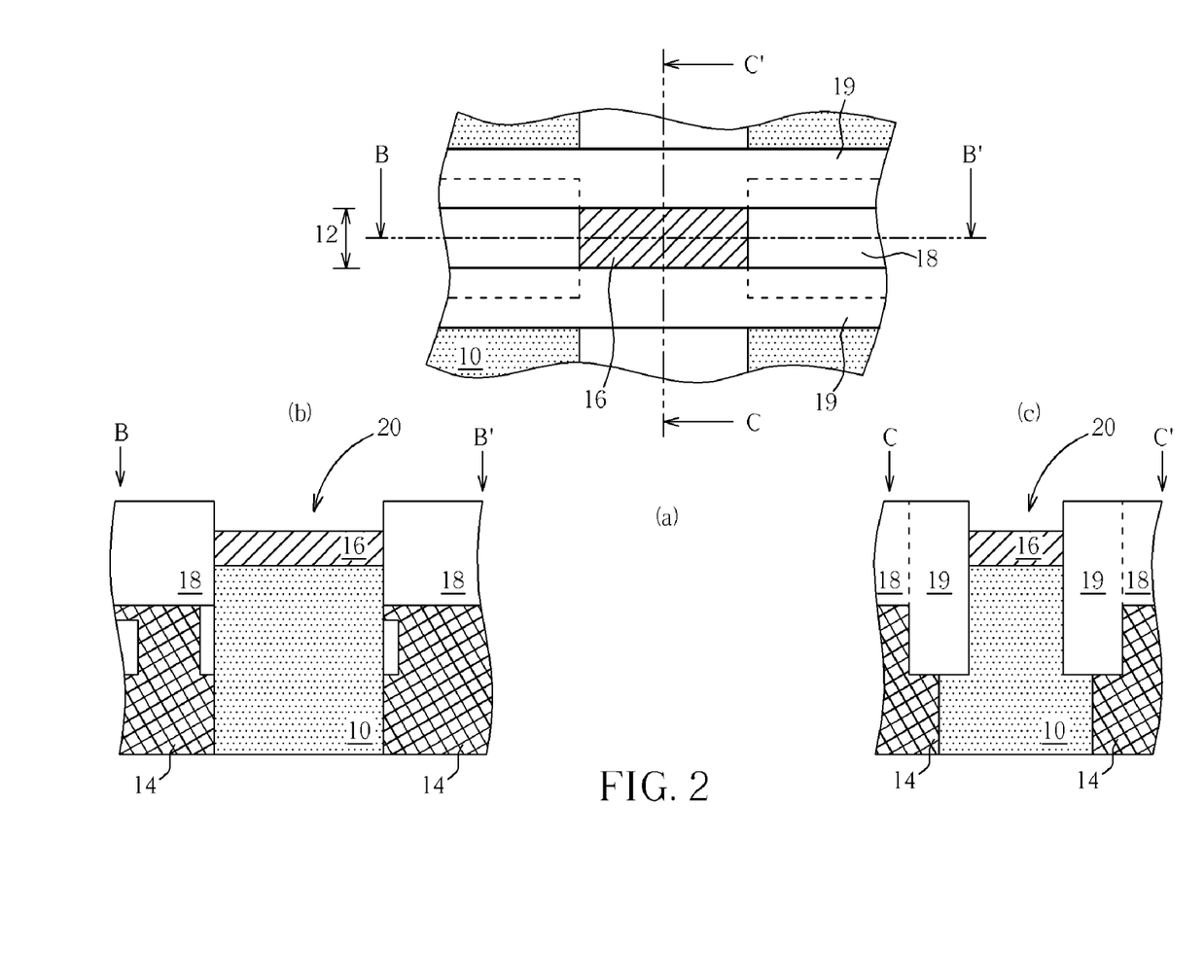

Please refer to FIG. 2. An etch process is performed to remove an upper portion of the hard mask layer 16. A recess 20 is formed between the remaining hard mask layer 16 and the sidewall of the two neighboring top trench oxide layers 18.

Figure 3:
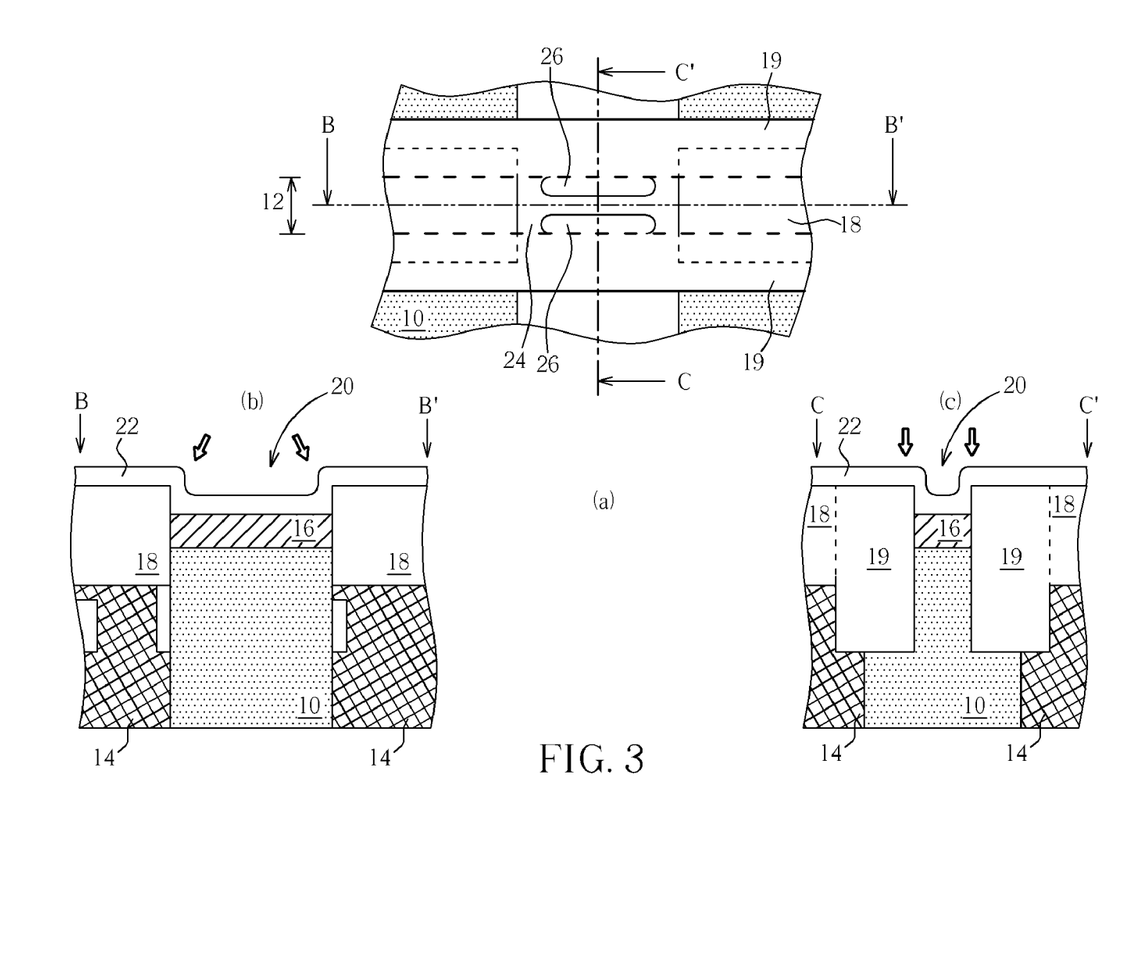

Please refer to FIG. 3. A gate defining layer 22 comprising silicon, such as a polysilicon layer, is conformally deposited on a surface of the hard mask layer 16 and the top trench oxide layer 18. The gate defining layer 22 has a thickness between 5-40 nanometer (nm). The preferred thickness of the gate defining layer 22 is about 20 nm.

Subsequently, a tilt angle ion implantation process is performed that implants dopants, such as $BF_2+$ or other kinds of ions, into the gate defining layer 22 formed on the sidewall of the recess 20. The tilt angle ion implantation process implants dopants into the gate defining layer 22 with a tilt angle that according to the preferred embodiment of the present invention is to perform the tilt angle ion implantation process for each side of the sidewall of the recess 20 with a different respective angle. A doped region 24 is formed in the doped gate defining region 22. Contrary to the doped region 24, a non-doped region 26 is formed in the gate defining layer 22. In addition, the doped region 24 and the non-doped region 26 are to define a pattern on the gate defining layer 22, and that the pattern represents a contour outline of a fin structure.

It should be noted that the gate defining layer 22 is formed on the recess 20 prior to the performing of the tilt angle ion implantation. The sizes of the doped region 24 and the non-doped region 26 are determined by the thickness of the gate defining layer 22 after the etch process and the angle of implantation during the tilt angle ion implantation process. Therefore, the thickness of the gate defining layer 22 may be adjusted depending on the size of the recess so that the tilt angle ion implantation may be performed with angles of wider tolerance range.

Figure 4:
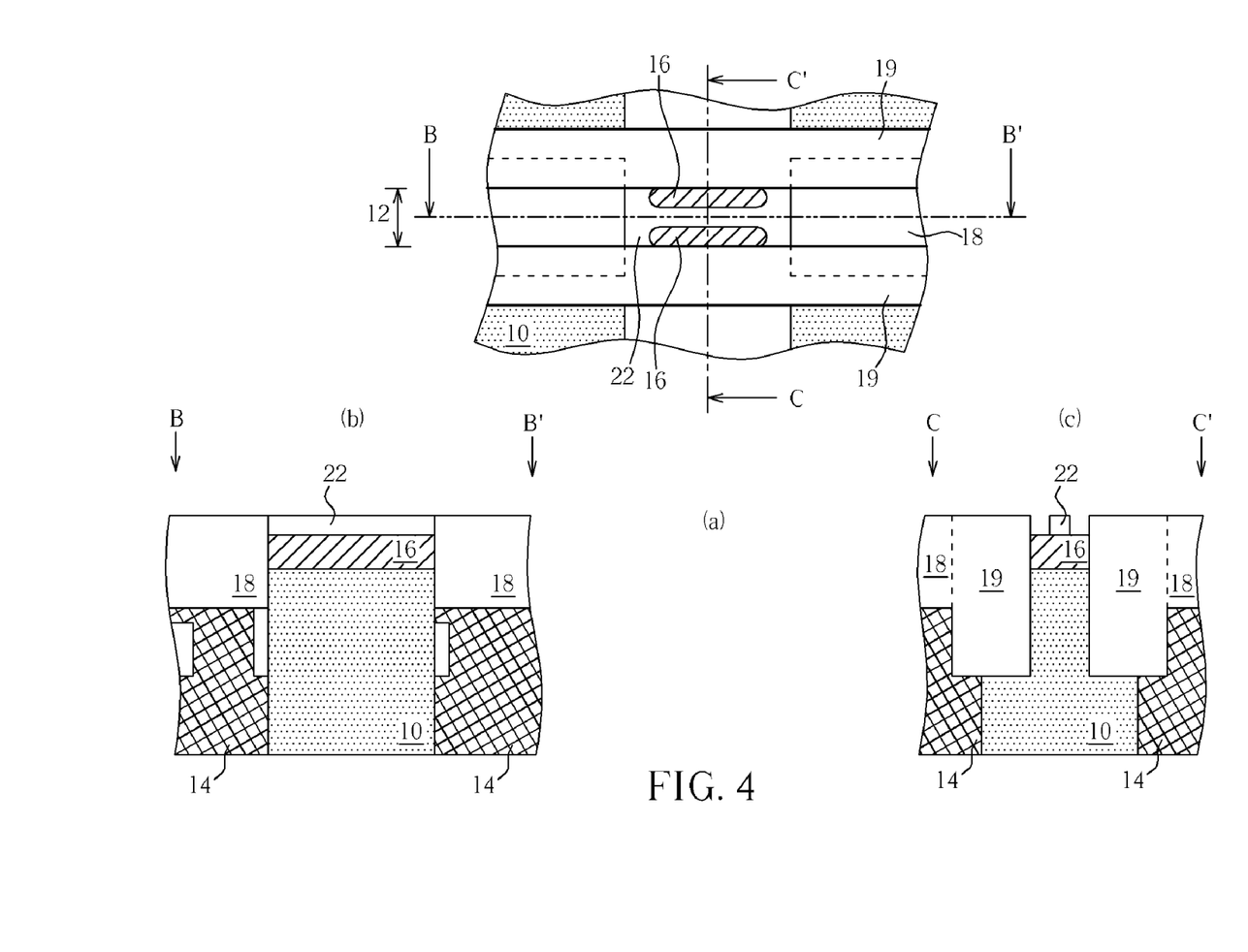

As shown in FIG. 4, a chemical mechanical polishing (CMP) process is optionally performed to remove most of the gate defining layer 22 and a portion of the top trench oxide layer 18. The remaining gate defining layer 22 is positioned at the bottom of the recess 20 (not shown) so that the remained gate defined layer 22 and the trench top layer 18 has a surface on the same plane.

Please refer to FIG. 3 and FIG. 4. Base on the implantation process, the doped region 24 and the non-doped region 26 have different etch selectivity. A first etch process is performed, preferably a wet etch process, to remove a portion of the gate defining layer 22 in the non-doped region 26 and to partially expose the surface of the hard mask layer 16. As shown in FIG. 4(a), the gate defining layer 22 has a fin pattern after the non-doped region 26 of the gate defining layer 22 is removed.

Figure 5:
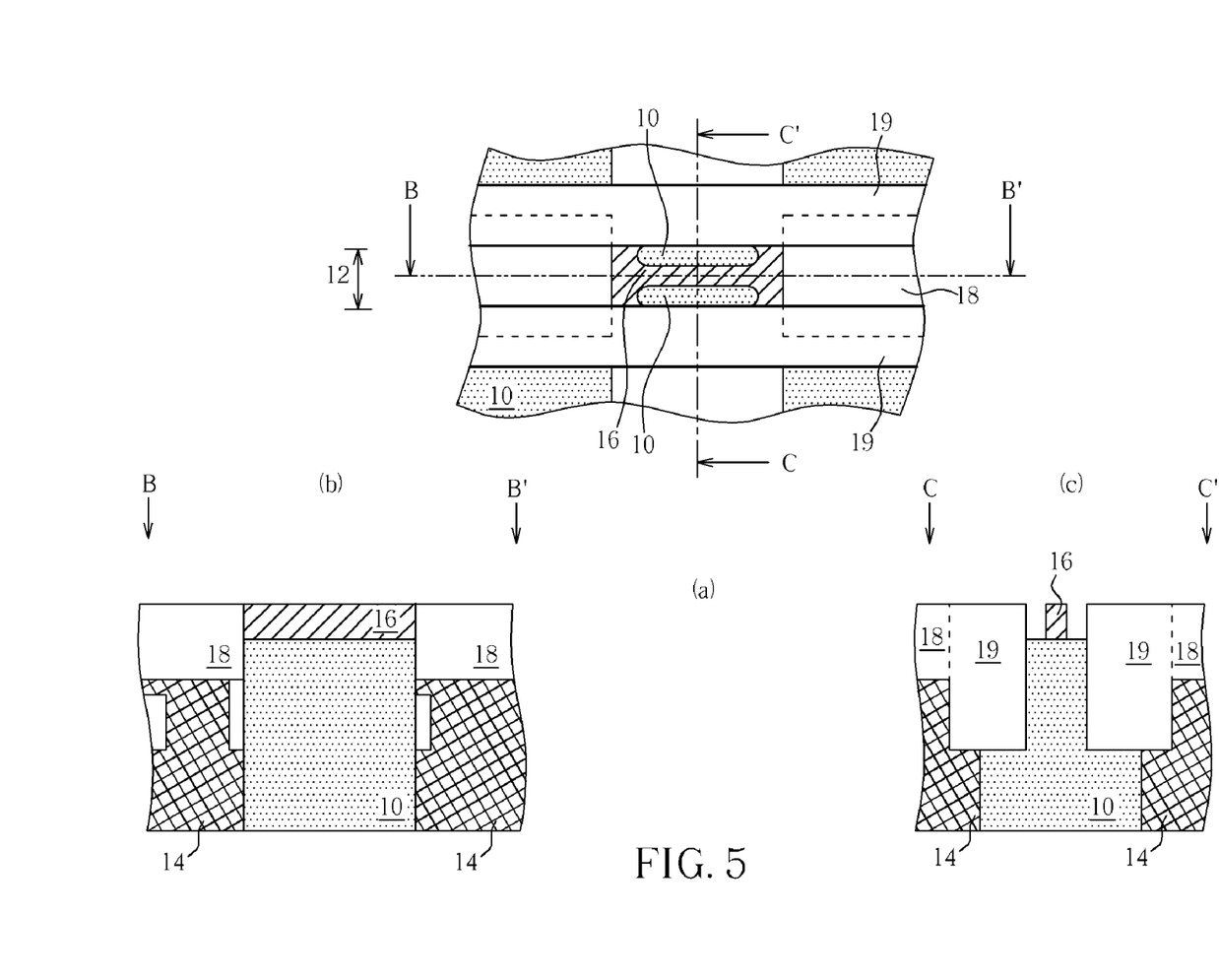

Please refer to FIG. 5, a second etch process is performed subsequently to the first etch process, which thereby removes the non-doped region 26 (not shown). The second etch process is performed to partially etch the hard mask layer 16 utilizing the remained gate defined layer 22 as an mask for transferring the fin pattern onto the hard mask layer 16. After that, the remaining gate defining layer 22 is removed.

Figure 6:
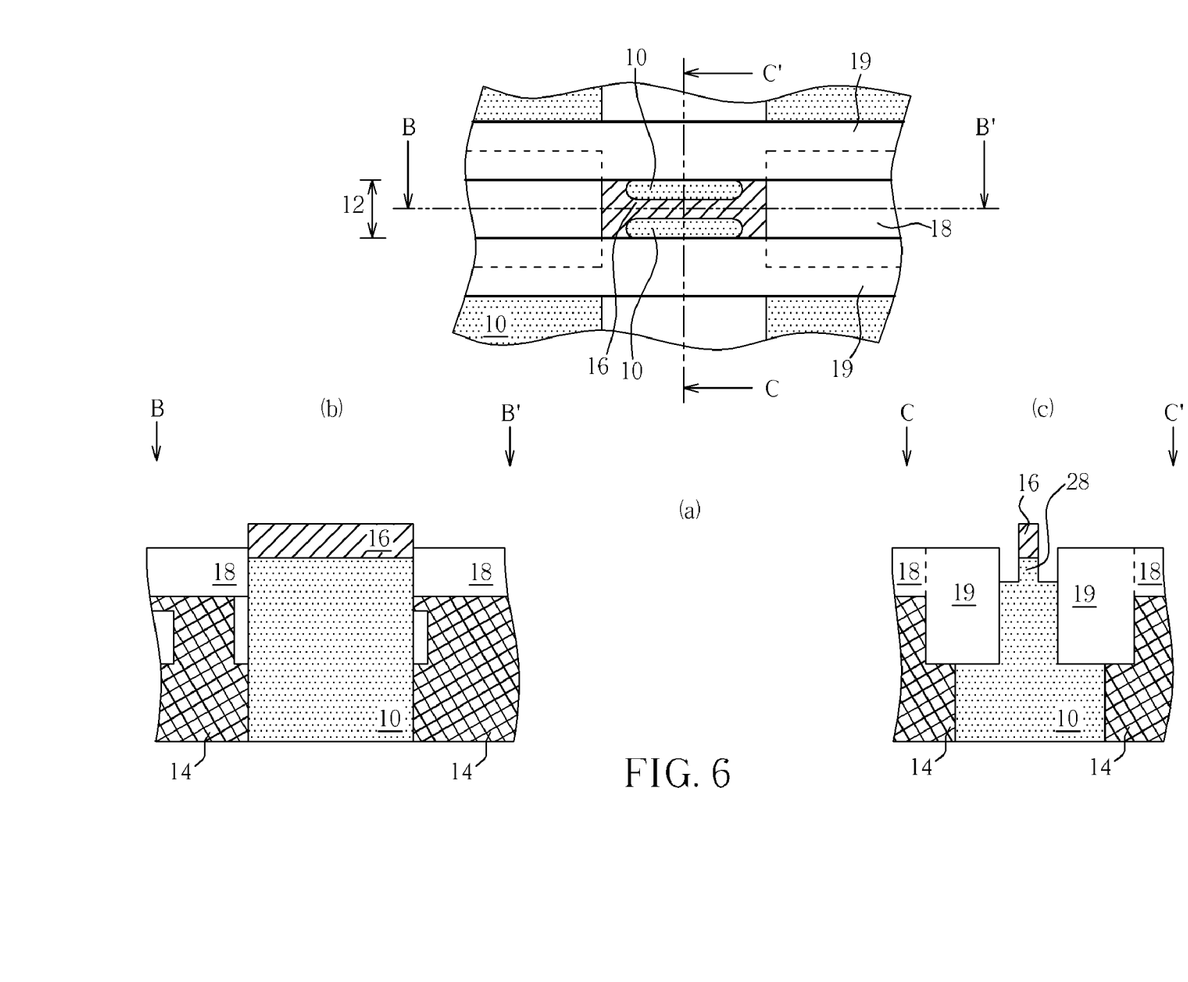

As shown in FIG. 6, the hard mask layer 16 having the fin pattern is used as another etching mask to perform an anisotropic etch process for etching the semiconductor substrate 10 and forming a fin structure 28.

Figure 7:
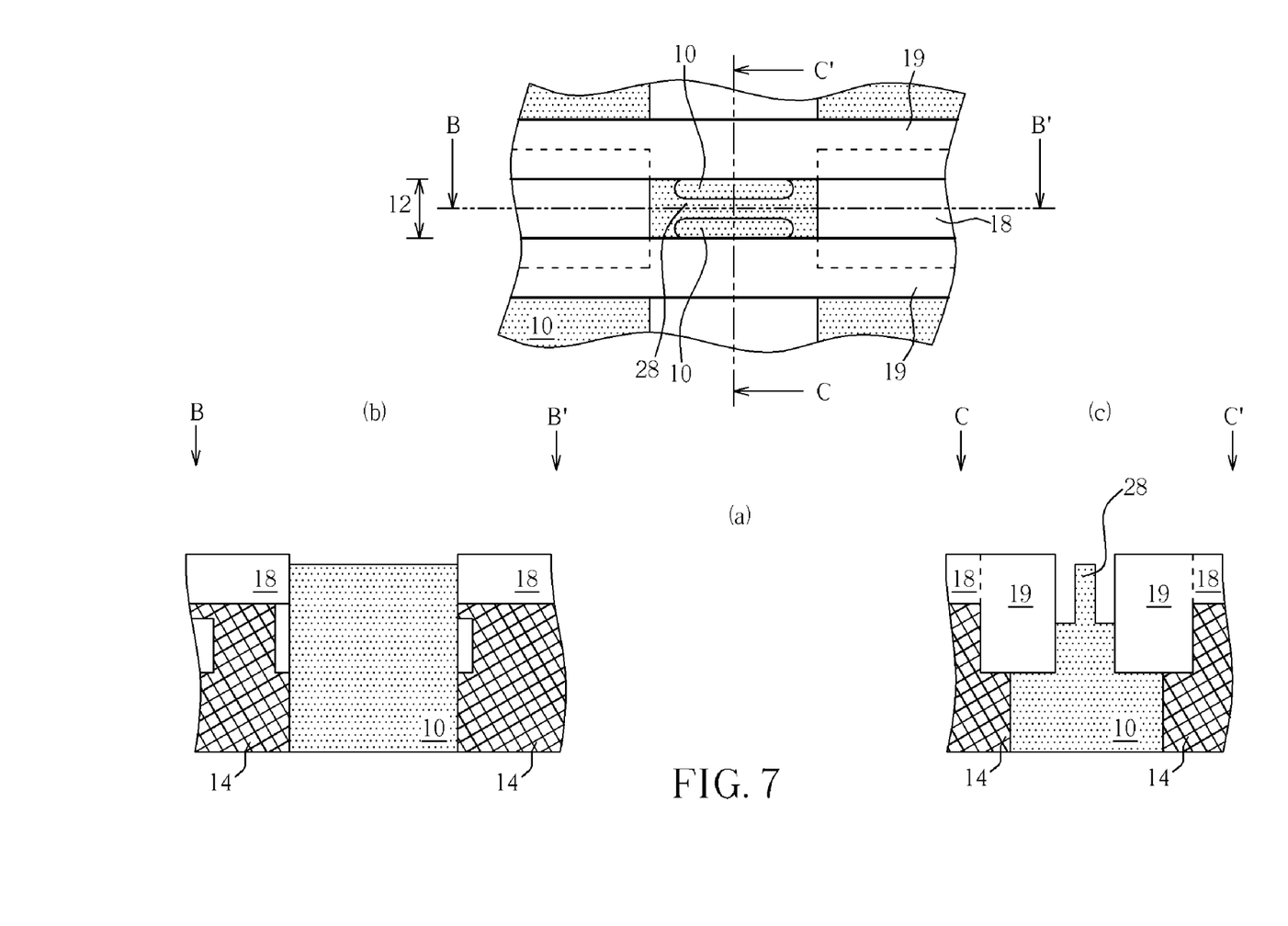

Please refer to FIG. 7, the hard mask layer 16 and a portion of the top trench oxide layer 18 and isolation structure 19 are removed to expose the fin structure 28. An isotropic etch process may be performed to make the fin structure 28 to be of a thinner width.

At least a gate material layer 30 is formed to fill up the spaces on the two respective sides of the fin structure 28 and to cover a portion of the active area 12 to form a word line 32. Both sides of the fin structure 28 and the upper portion of the fin structure 28 are sandwiched by the gate material layer 30.

Figure 8:
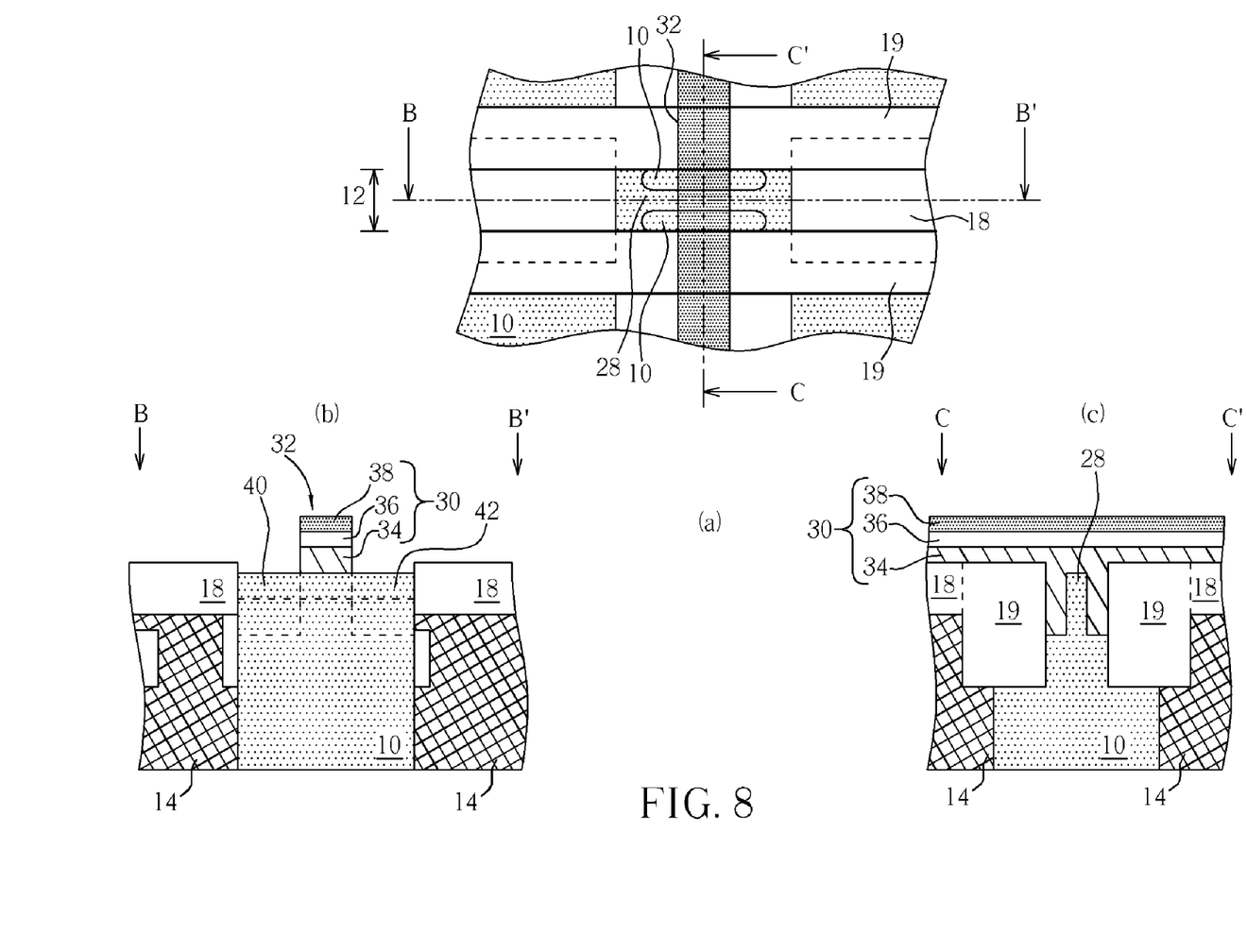

The gate material 30 may include a polysilicon layer 34, a metal layer 36, and a silicon nitride layer 38. The word line 32 is formed by means of depositing the polysilicon layer 34, the metal layer 36, and the silicon nitride layer 38, respectively, and defining the word line 32 by using a lithography and etch process. After that, a source 40 and a drain 42 are respectively formed the two respective sides of the word line 32 on the semiconductor substrate 10, and consequently a finFET device of the present invention is formed.

According to the above, the method of forming a finFET device of the present invention forms the fin structure by means of utilizing the gate defining layer on the semiconductor layer and the hard mask layer underlying the gate defining layer and operating in coordination with the tilt angle ion implantation process without forming the photoresist and defining the fin pattern by any additional lithography and etch processes. Therefore, the problems for defining the contour outline and the CD variation of the fin structure are resolved. The method of the present invention may also reduce the use of the mask and the cost for designing the pattern of the mask. Consequently, the production cost and process time are reduced. In addition, the method of the present invention may be performed to form typical finFET device or DRAM array, such as forming the structure of the checkerboard deep trench DRAM array layout.

Those skilled in the art will readily observe that numerous modifications and alterations of the device and method may be made while retaining the teachings of the invention.

What is claimed is:

1. A method of forming a fin structure in a substrate comprising:
    forming a plurality of trench capacitors in the substrate, each trench capacitor having a dielectric layer disposed thereon, and a substrate top surface is exposed between two neighboring trench capacitors;
    forming a mask layer on the substrate top surface, wherein a surface of the mask layer is lower than a surface of the dielectric layer formed on top of each of the trench capacitors;
    conformally forming a gate defining layer on the surfaces of the mask layer and the dielectric layer;
    partially removing the gate defining layer to partially expose the mask layer;
    removing the exposed mask layer to partially expose the substrate; and
    partially removing the exposed substrate so that the fin structure in the substrate is formed.

2. The method of forming a fin structure in a substrate according to claim 1, wherein the gate defining layer partially removing steps comprise an implantation process and a polishing process.

3. The method of forming a fin structure in a substrate according to claim 2, wherein the implantation process is performed with a tilt angle.

4. A method of forming a finFET device comprising:
    providing a semiconductor substrate comprising multiple trench capacitors respectively having a top trench oxide layer disposed thereon, and an active area disposed between two adjacent trench capacitors, wherein the top trench oxide layer having a height higher than that of the active area;
    forming a hard mask layer covering the surface of the active area;
    conformally forming a gate defining layer on the top trench oxide layer and the hard mask layer;
    removing a portion of the gate defining layer to form a pattern;
    transferring the pattern to the hard mask layer to form a patterned hard mask layer;
        partially removing the semiconductor substrate to form a fin structure utilizing the patterned hard mask layer as an etching mask;
    removing the patterned hard mask layer;
    forming a gate material on the active area; and
    forming a source and a drain in the active area.

5. The method of forming a finFET device according to claim 4, wherein a chemical mechanical polishing process is performed to partially remove the gate defining layer disposed on the top trench oxide layer before the gate defining layer is removed.

6. The method of forming a finFET device according to claim 4, wherein the gate defining layer comprises polysilicon.

* * * * *